(12) United States Patent
Kuriyama

(10) Patent No.: US 7,791,159 B2
(45) Date of Patent: Sep. 7, 2010

(54) SOLID-STATE IMAGING DEVICE AND METHOD FOR FABRICATING THE SAME

(75) Inventor: Toshihiro Kuriyama, Shiga (JP)

(73) Assignee: Panasonic Corporation, Osaka (JP)

( * ) Notice: Subject to any disclaimer, the term of this patent is extended or adjusted under 35 U.S.C. 154(b) by 1 day.

(21) Appl. No.: 12/261,357

(22) Filed: Oct. 30, 2008

(65) Prior Publication Data

US 2009/0108391 A1    Apr. 30, 2009

(30) Foreign Application Priority Data

Oct. 30, 2007   (JP)   ............... 2007-281780
Oct. 1, 2008    (JP)   ............... 2008-256459

(51) Int. Cl.
    *H01L 29/78* (2006.01)
(52) U.S. Cl. ............. 257/443; 257/444; 257/446; 257/448; 257/E31.124
(58) Field of Classification Search ............ 257/443, 257/444, 446, 448, E31.124; 438/59
    See application file for complete search history.

(56) References Cited

U.S. PATENT DOCUMENTS

| | | | |
|---|---|---|---|
| 5,721,447 A * | 2/1998 | Oosawa et al. | ............. 257/461 |
| 6,344,668 B1 | 2/2002 | Hatano et al. | |
| 7,074,638 B2 | 7/2006 | Maeda et al. | |
| 7,180,092 B2 * | 2/2007 | Yamazaki et al. | ............. 257/59 |
| 7,352,043 B2 * | 4/2008 | Gidon | ............. 257/440 |
| 2006/0051887 A1 | 3/2006 | Yamamoto et al. | |
| 2008/0042227 A1 | 2/2008 | Asano et al. | |

FOREIGN PATENT DOCUMENTS

| | | |
|---|---|---|
| JP | 2007-134725 | 5/2007 |
| JP | 3917649 | 5/2007 |

\* cited by examiner

*Primary Examiner*—Mary Wilczewski
*Assistant Examiner*—Paul E Patton
(74) *Attorney, Agent, or Firm*—McDermott Will & Emery LLP

(57) ABSTRACT

A solid-state imaging device comprises an imaging region, a peripheral circuit region formed in an outer peripheral portion of the imaging region, a first conductivity type semiconductor substrate having the imaging region and the peripheral circuit region on a main surface thereof, a second conductivity type first semiconductor layer formed in the semiconductor substrate, a first conductivity type second semiconductor layer formed in first semiconductor layer, a through electrode formed in a through hole penetrating through the semiconductor substrate in a thickness direction of the semiconductor substrate, and a pad portion formed on the semiconductor substrate and connected to the through electrode. The through hole penetrates through a first conductivity type region of the semiconductor substrate.

9 Claims, 10 Drawing Sheets

SOLID-STATE IMAGING DEVICE AND METHOD FOR FABRICATING THE SAME

BACKGROUND OF THE INVENTION

1. Field of the Invention

The present invention relates to a Charge Coupled Device (CCD) type solid-state imaging device and a Metal Oxide Semiconductor (MOS) type solid-state imaging device.

2. Description of the Related Art

In recent years, there is an increasing demand for a solid-state imaging device as an imaging device for use in digital still cameras and digital camcorders. Also, mobile terminal devices, such as a mobile telephone and the like, are expected to additionally have a camera function. Therefore, there is also an increasing demand for a solid-state imaging device as an imaging device for use in such mobile terminal devices. The number of pixels of a solid-state imaging device tends to increase year after year to achieve higher-quality images. The solid-state imaging device is also desired to have a higher sensitivity and a higher S/N ratio so as to respond to a request for an increase in sensitivity of digital still cameras, digital camcorders, and mobile terminal devices.

Here, a structure common to conventional CCD solid-state imaging devices and conventional MOS solid-state imaging devices will be described with reference to FIG. 12 and FIGS. 13A and 13B.

FIG. 12 is a plan view showing a schematic structure of a conventional solid-state imaging device.

As shown in FIG. 12, an internal circuit region 101 having a light receiving portion and a drive circuit portion is provided at a middle portion of a semiconductor substrate 100, and a peripheral circuit region 102 having a pad portion and a protective circuit portion is provided at a peripheral portion of the semiconductor substrate 100. The internal circuit region 101 and the peripheral circuit region 102 are connected to each other via a wiring line L.

FIGS. 13A and 13B are diagrams showing a structure of a region a of FIG. 12 that is a main portion the conventional solid-state imaging device. Specifically, FIG. 13A is a plan view taken along line XIIIa-XIIIa of FIG. 13B, and FIG. 13B is a cross-sectional view taken along XIIIb-XIIIb of FIG. 13A.

As shown in FIGS. 13A and 13B, a P-type semiconductor layer 112 is formed in a semiconductor substrate 111 made of N-type silicon, and an $N^+$-type semiconductor layer 113 is formed in a surface layer portion of the P-type semiconductor layer 112. On a surface of the semiconductor substrate 111, an insulating film 114 covering the P-type semiconductor layer 112 and the $N^+$-type semiconductor layer 113 and having an opening portion through which a portion of the $N^+$-type semiconductor layer 113 is exposed, is formed. Note that a plurality of light receiving portions arranged two-dimensionally, vertical transfer portions (vertical CCDs) arranged along respective vertical columns of the light receiving portions, and a horizontal transfer portion (horizontal CCD) provided adjacent to an end row of the light receiving portions are provided in the P-type semiconductor layer 112. The light receiving portion, which is a photodiode made of the $N^+$-type semiconductor layer 113 formed in the P-type semiconductor layer 112, accumulates electric charges, depending on the intensity of received light. The peripheral circuit, the protective circuit and the like are also formed in the P-type semiconductor layer 112.

A through hole 116 penetrating through the insulating film 114, the semiconductor substrate 111 and the P-type semiconductor layer 112 is formed in the insulating film 114 and the semiconductor substrate 111. An insulating film 117 is formed on a sidewall portion of the through hole 116 and on a rear surface of the semiconductor substrate 111. A through electrode 118 is formed, filling an inside of the insulating film 117. A pad portion 115 that is connected to the $N^+$-type semiconductor layer 113 and the through electrode 118 via the opening portion of the insulating film 114 is formed on a front side of the semiconductor substrate 111, specifically on the insulating film 114 and the insulating film 117. The pad portion 115 is connected via the wiring line L to the internal circuit region 101 (see FIG. 12). On the other hand, on a rear side of the semiconductor substrate 111, a rear surface electrode 119 that is connected to the through electrode 118 is formed on the insulating film 117, and an insulating resin layer 120 is formed, covering the rear surface electrode 119 while exposing a portion thereof. A protruding electrode 121 that is connected to the rear surface electrode 119 is formed in the opening portion of the insulating resin layer 120.

Incidentally, in the above-described structure of the conventional solid-state imaging device, when the through hole 116 is formed by etching, the through hole 116 penetrates through a PN junction region of the semiconductor substrate 111. Therefore, since the etching rate differs between the P-type semiconductor layer and the N-type semiconductor layer due to a difference in crystal face, etching damage or substrate roughness may occur, leading to an increase in leakage current at the PN junction or an increase in dark current that is particularly more significant during an operation at high temperature. If a dark current increases, the circuit operation of the drive circuit portion is interfered, depending on the arrangement of the light receiving portion and the drive circuit portion.

Specifically, the pad portion 115 has a layered structure of Ti/TiN/Al, and accordingly, the through hole 116 is formed by chipping a part of the Ti/TiN/Al layer of the pad portion 115. The chipped metals serve as metal contamination and remain on the exposed surface of the PN junction to invite an increase in leakage current at the PN junction and an increase in dark current.

The leakage current and the dark current invite malfunction in the circuit operation of the drive circuit portion. The increase in dark current also invites defects in the image, such as white flaws, which are critical in imaging devices.

These problems may become apparent after long-term use.

SUMMARY OF THE INVENTION

In view of the above-described problems, the present invention has been achieved. An object of the present invention is to provide a solid-state imaging device having a structure that can suppress an increase in leakage current at the PN junction and an increase in dark current, and a method for fabricating the device.

To achieve the object, a solid-state imaging device according to an aspect of the present invention comprises an imaging region having a plurality of light receiving portions arranged two-dimensionally and for generating signal electric charges by photoelectric conversion, a peripheral circuit region formed in an outer peripheral portion of the imaging region, a first conductivity type semiconductor substrate having the imaging region and the peripheral circuit region on a main surface thereof, a second conductivity type first semiconductor layer formed in the first conductivity type semiconductor substrate, a first conductivity type second semiconductor layer formed in first semiconductor layer, a through electrode formed in a through hole penetrating through the semiconductor substrate in a thickness direction of the semiconductor substrate, and a pad portion formed on the semiconductor substrate and connected to the through electrode. The through hole penetrates through a first conductivity type region of the semiconductor substrate.

The solid-state imaging device of the aspect of the present invention further comprises a first conductivity type third semiconductor layer that is adjacent to the first semiconductor layer covering the second semiconductor layer and electrically connected via the pad portion to the through electrode, and is formed in at least a region between the first semiconductor layer and the through hole, in a surface layer portion of the semiconductor substrate. The third semiconductor layer is a region having a higher impurity concentration than that of the semiconductor substrate.

In the solid-state imaging device of the aspect of the present invention, the third semiconductor layer is formed and spaced from an edge portion of the through hole.

The solid-state imaging device of the aspect of the present invention further comprises a first conductivity type fourth semiconductor layer formed in at least a sidewall portion of the through hole facing the first semiconductor layer covering the second semiconductor layer and electrically connected via the pad portion to the through electrode. The fourth semiconductor layer is a region having a higher impurity concentration than that of the semiconductor substrate.

The solid-state imaging device of the aspect of the present invention further comprises a second conductivity type fifth semiconductor layer formed in the semiconductor substrate. The through hole penetrates through a first conductivity type region of the semiconductor substrate and a second conductivity type region of the fifth semiconductor layer. The fifth semiconductor layer through which the through hole penetrates is separated from the first semiconductor layer, and is electrically connected to the semiconductor substrate.

The solid-state imaging device of the aspect of the present invention further comprises a first conductivity type sixth semiconductor layer that is adjacent to the first semiconductor layer covering the second semiconductor layer and electrically connected via the pad portion to the through electrode, and is formed in at least a region between the first semiconductor layer and the fifth semiconductor layer, in a surface layer portion of the semiconductor substrate. The sixth semiconductor layer is a region having a higher impurity concentration than that of the semiconductor substrate.

In the solid-state imaging device of the aspect of the present invention, the through hole penetrates a first conductivity type region of the semiconductor substrate and a second conductivity type region of the first semiconductor layer. The solid-state imaging device further comprises a first conductivity type seventh semiconductor layer that is adjacent to the first semiconductor layer covering the second semiconductor layer and electrically connected via the pad portion to the through electrode, and is formed in at least a region facing the through hole, in a sidewall portion of the through hole. The seventh semiconductor layer has a higher impurity concentration than that of the semiconductor substrate.

In the solid-state imaging device of the aspect of the present invention, the first conductivity type is N type and the second conductivity type is P type.

A method for fabricating the solid-state imaging device of the aspect of the present invention is also provided in which the step of forming a region having a higher impurity concentration than that of the semiconductor substrate and the step of forming the light receiving portion are preferably the same step, or the step of forming a region having a higher impurity concentration than that of the semiconductor substrate and the step of forming a source/drain region of an MOSFET in the peripheral circuit region are preferably the same step.

According to the solid-state imaging device of the present invention and its fabrication method, an increase a leakage current at a PN junction and an increase in a dark current can be suppressed, resulting in a high sensitivity and a high S/N ratio. Thereby, a smaller and thinner camera capable of shooting a dark scene can be achieved. As a result, an easy-to-use camera is achieved, and the flexibility of design of a camera is improved.

BRIEF DESCRIPTION OF THE DRAWINGS

FIG. 1A is a plan view taken along line Ia-Ia of FIG. 1B and FIG. 1B is a cross-sectional view taken along line Ib-Ib of FIG. 1A.

FIG. 2A is a plan view taken along line IIa-IIa of FIG. 2B and FIG. 2B is a cross-sectional view taken along line IIb-IIb of FIG. 2A.

FIG. 4A is a plan view taken along line IVa-IVa of FIG. 4B and FIG. 4B is a cross-sectional view taken along line IVb-IVb of FIG. 4A.

FIG. 7A is a plan view taken along line VIIa-VIIa of FIG. 7B and FIG. 7B is a cross-sectional view taken along line VIIb-VIIb of FIG. 7A.

FIG. 8A is a plan view taken along line VIIIa-VIIIa of FIG. 8B and FIG. 8B is a cross-sectional view taken along line VIIIb-VIIIb of FIG. 8A.

13A is a plan view taken along line XIIIa-XIIIa of FIG. 13B and FIG. 13B is a cross-sectional view taken along XIIIb-XIIIb of FIG. 13A.

DETAILED DESCRIPTION OF THE PREFERRED EMBODIMENTS

Hereinafter, embodiments of the present invention will be described with reference to the accompanying drawings.

First Embodiment

Figure 1A:
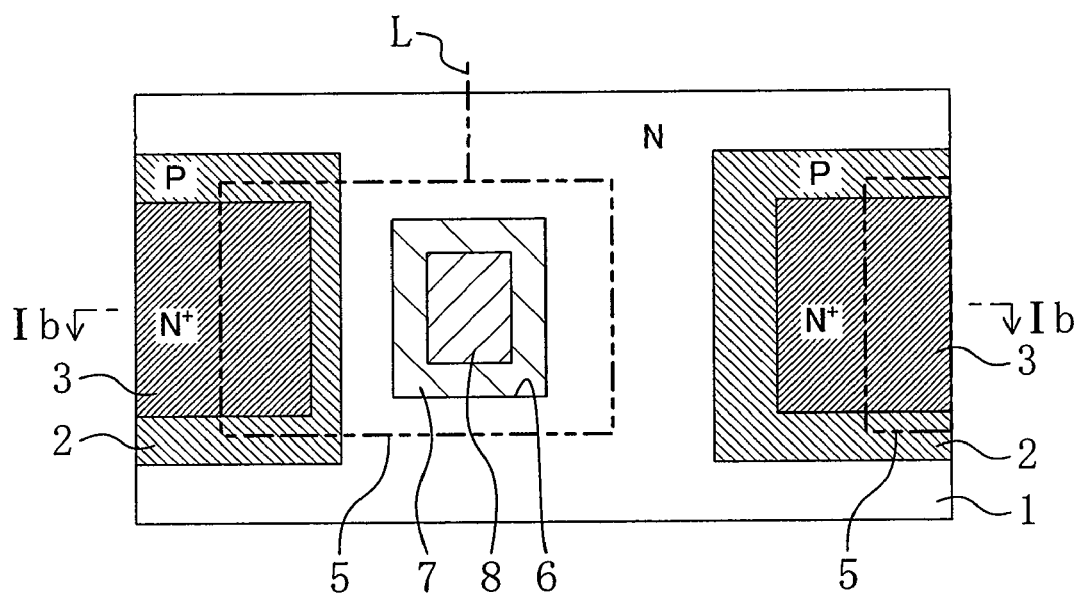
FIGS. 1A and 1B are diagrams showing a structure of a solid-state imaging device according to a first embodiment of the present invention, specifically.
Figure 1B:
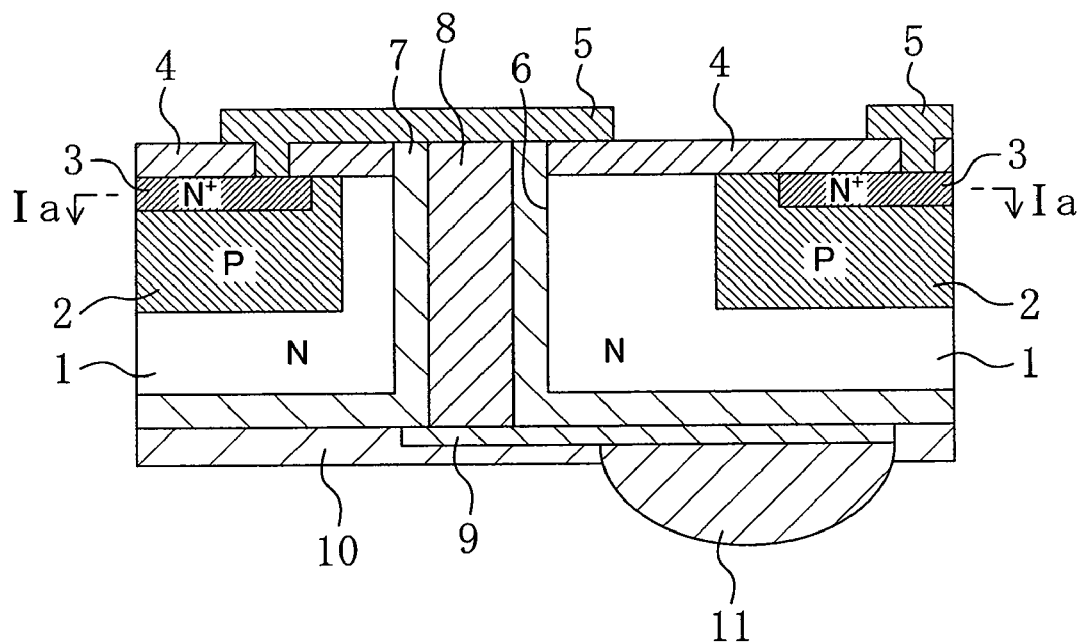
Figure 12:
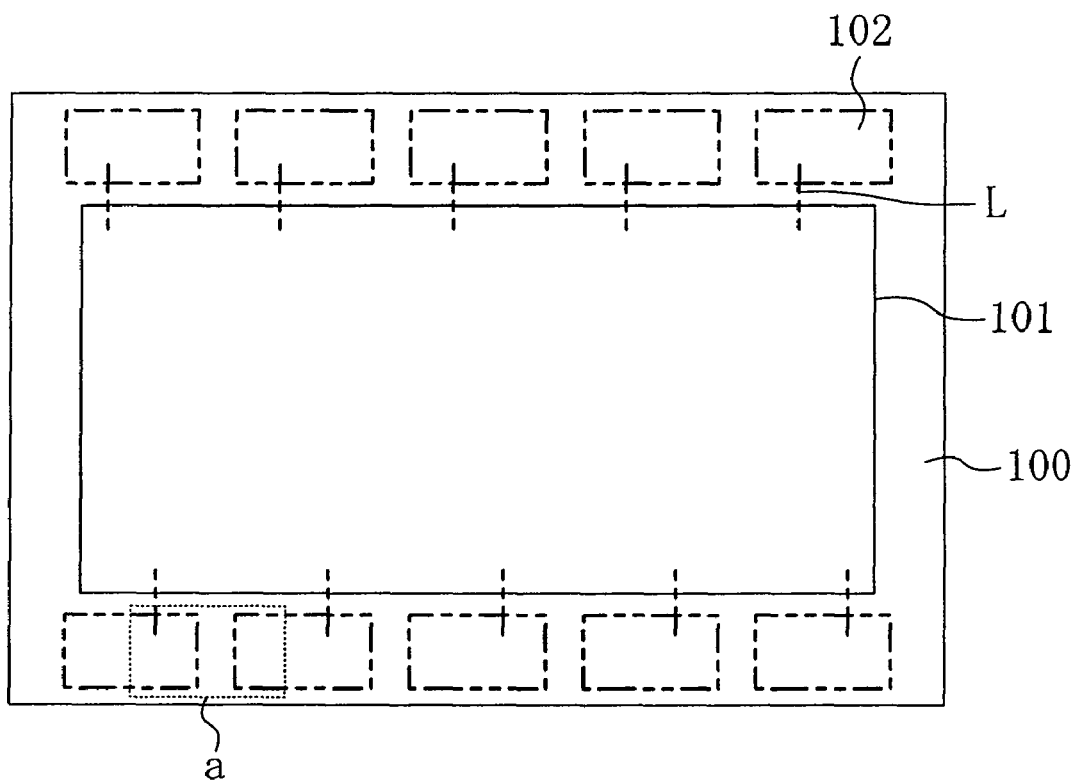
FIG. 12 is a plan view showing a schematic structure of a conventional solid-state imaging device.

FIGS. 1A and 1B are diagrams showing a structure of a solid-state imaging device according to a first embodiment of the present invention, particularly showing a portion corresponding to the region a of the conventional device of FIG. 12. Specifically, FIG. 1A is a plan view taken along line Ia-Ia of FIG. 1B, and FIG. 1B is a cross-sectional view taken along line Ib-Ib of FIG. 1A.

As shown in FIGS. 1A and 1B, a P-type semiconductor layer 2 having an impurity concentration of about $2.0 \times 10^{15}/\text{cm}^3$ is formed in a semiconductor substrate 1 made of N-type silicon having an impurity concentration of about $1.0 \times 10^{15}/\text{cm}^3$. An $N^+$-type semiconductor layer 3 having an impurity concentration of about $10 \times 10^{20}/\text{cm}^3$ is formed in a surface layer portion of the P-type semiconductor layer 2. On a surface of the semiconductor substrate 1, an insulating film 4 is formed, covering the P-type semiconductor layer 2 and the $N^+$-type semiconductor layer 3 and having an opening portion through which a portion of the $N^+$-type semiconductor layer 3 is exposed.

The P-type semiconductor layer 2 and the $N^+$-type semiconductor layer 3 form a protective circuit in a peripheral circuit region (see 102 in FIG. 12). The P-type semiconductor layer 2 is preferably grounded so that electric charges are dissipated. The grounding of the P-type semiconductor layer 2 may be achieved by connecting it to the outside via a wiring line or a through electrode without forming the $N^+$-type semiconductor layer 3 (not shown). Moreover, if connection to the outside is established via a wiring line or a through electrode without forming the P-type semiconductor layer 2 or the $N^+$-type semiconductor layer 3, connection to the semiconductor substrate 1 can be achieved (not shown). By such connection, a voltage can also be applied to the semiconductor substrate 1, so that, for example, electric charges can be reset in a CCD solid-state imaging device.

Also, in an internal circuit region (see 101 in FIG. 12), in the P-type semiconductor layer 2, an imaging region having a plurality of light receiving portions that are arranged two-dimensionally and are used for generating signal electric charges by photoelectric conversion, vertical transfer portions (vertical CCDs) that are arranged along respective vertical columns of the light receiving portions, a horizontal transfer portion (horizontal CCD) that is provided adjacent to an end row of the light receiving portions, and a peripheral circuit region that is formed in an outer peripheral portion of the imaging region, are provided. Note that the light receiving portion in the internal circuit region, which is a photodiode made of the $N^+$-type semiconductor layer 3 formed in the P-type semiconductor layer 2, accumulates electric charges, depending on the intensity of received light.

The P-type semiconductor layer 2 and the $N^+$-type semiconductor layer 3 may be formed in the internal circuit region and the peripheral circuit region in the same step, thereby making it possible to reduce the number of steps. Alternatively, if the P-type semiconductor layer 2 and the $N^+$-type semiconductor layer 3 are formed in separated steps, their concentrations and shapes can be determined so that they have maximized characteristics.

A through hole 6 is formed in the insulating film 4 and the semiconductor substrate 1. The through hole 6, which penetrates through the insulating film 4 and the semiconductor substrate 1, has an opening diameter of about 70 μm and a depth of about 200 μm. An insulating film 7 is formed on a sidewall portion of the through hole 6 and a rear surface of the semiconductor substrate 1. A through electrode 8 is formed, filling an inside of the insulating film 7. A pad portion 5 preferably has a concave portion that is connected to the through electrode 8 so as to increase an area where the pad portion 5 contacts the through electrode 8 and provide reliable contact.

The pad portion 5, which is made of a conductive film that is connected via the opening portion of the insulating film 4 to the $N^+$-type semiconductor layer 3 and the through electrode 8, is formed on a front side of the semiconductor substrate 1, specifically on the insulating film 4 and the insulating film 7. The pad portion 5 is connected via a wiring line L to the internal circuit region 101 (see FIG. 12). On the other hand, a rear surface electrode 9 made of a conductive film that is connected to the through electrode 8, and an insulating resin layer 10 covering the rear surface electrode 9 and having an opening portion through which a portion of the rear surface electrode 9 is exposed, are formed on a rear side of the semiconductor substrate 1, specifically on the insulating film 7. A protruding electrode 11 made of a conductive film that is connected to the rear surface electrode 9 is formed in the opening portion of the insulating resin layer 10.

Although the insulating film 4 in the peripheral circuit region is indicated by a single reference numeral, the insulating film 4 in the internal circuit region may be formed of a plurality of films or a plurality of types of films since an electrode, a multi-layer wiring line or the like required to drive an internal circuit may be formed in the internal circuit region.

According to the solid-state imaging device of this embodiment having the structure of FIGS. 1A and 1B, a region in which the P-type semiconductor layer 2 is formed is reduced as compared to the conventional art, and the through hole 6 does not penetrate through a PN junction region, as is different from the conventional art, and penetrates through a region having a single conductivity type, and the through electrode 8 is formed in the through hole 6. Therefore, as is different from the conventional art, it is possible to reduce and suppress a leakage current at a PN junction caused by etching damage or the like occurring when a through hole penetrates through the PN junction region, and a dark current that becomes more significant during an operation at high temperature, resulting in a solid-state imaging device having a high-sensitivity and a high S/N ratio, and also a camera comprising such a solid-state imaging device.

—Variation 1 of First Embodiment—

Figure 2A:
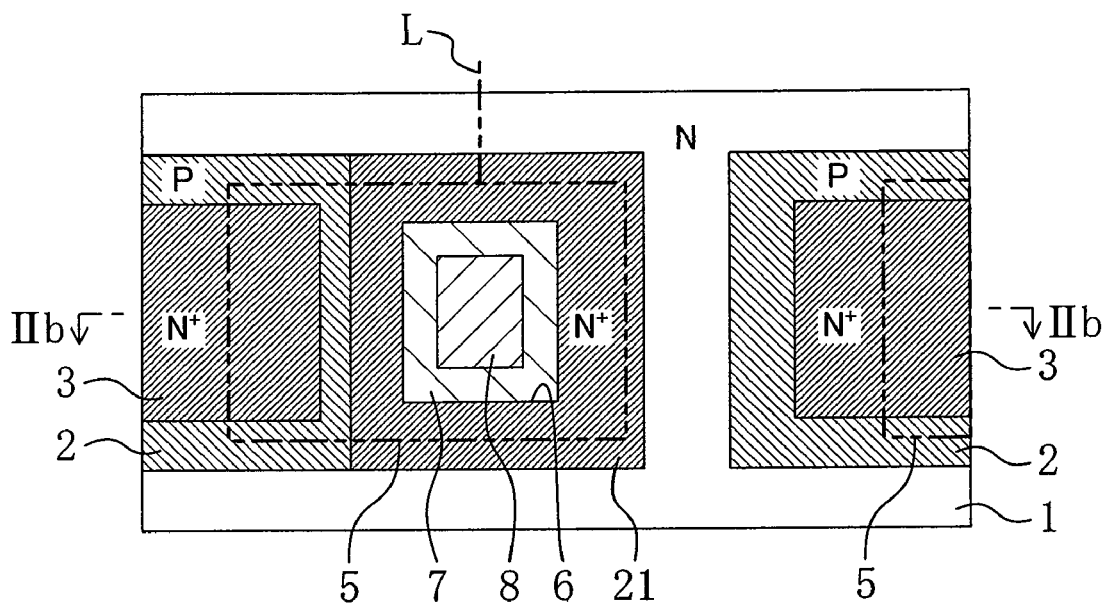
FIGS. 2A and 2B are diagrams showing a structure of a solid-state imaging device according to Variation 1 of the first embodiment of the present invention, specifically.
Figure 2B:
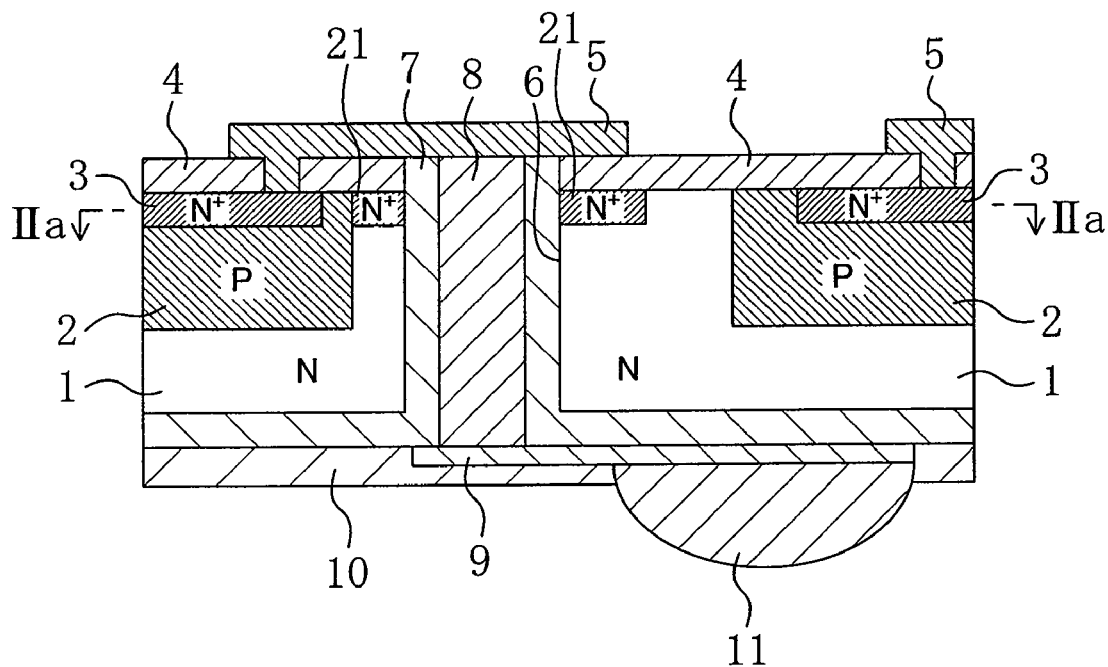

FIGS. 2A and 2B are diagrams showing a structure of a solid-state imaging device according to Variation 1 of the first embodiment of the present invention. Specifically, FIG. 2A is a plan view taken along line IIa-IIa of FIG. 2B, and FIG. 2B is a cross-sectional view taken along line IIb-IIb of FIG. 2A.

The solid-state imaging device of Variation 1 of FIGS. 2A and 2B has the following feature, as can be seen by comparing it with the solid-state imaging device of FIGS. 1A and 1B. An $N^+$-type semiconductor layer 21 having an impurity concentration of $10 \times 10^{15}$ to $10^{20}/\text{cm}^3$ is formed in a peripheral portion of the through hole 6 in a surface layer portion of the semiconductor substrate 1, and adjacent to the P-type semiconductor layer 2 (a left-hand portion as viewed from above the drawing paper) below the pad portion 5. Note that the other parts are similar to those of FIGS. 1A and 1B.

According to the solid-state imaging device of Variation 1 having the structure of FIGS. 2A and 2B, the following feature is obtained. When the semiconductor substrate 1 has a low impurity concentration as described above, a channel that becomes a leakage path is likely to be formed in a surface layer portion of the semiconductor substrate 1 below the pad portion 5. Nevertheless, as described above, the $N^+$-type semiconductor layer 21 is provided in the surface layer portion of the semiconductor substrate 1, thereby preventing reversal, i.e., preventing formation of a leakage path. As a result, a solid-state imaging device having a higher sensitivity and a higher S/N ratio can be achieved.

Although it has been described in Variation 1 that the $N^+$-type semiconductor layer 21 is formed, surrounding the through hole 6, as shown in FIG. 2A, the $N^+$-type semiconductor layer 21 may be formed at least only in a region adjacent to an edge portion facing the through hole 6 of the P-type semiconductor layer 2 (a left-hand portion as viewed from above the drawing paper) below the pad portion 5 without surrounding the through hole 6, so as to prevent formation of the leakage path.

Also, the $N^+$ semiconductor layer 21 and the $N^+$ semiconductor layer 2 may be formed in the same step, thereby making it possible to reduce the number of steps. Alternatively, if the $N^+$ semiconductor layer 21 and the $N^+$ semiconductor layer 2 are formed in separated steps, their concentrations and shapes can be determined so that they have maximized characteristics.

—Variation 2 of First Embodiment—

Figure 3:
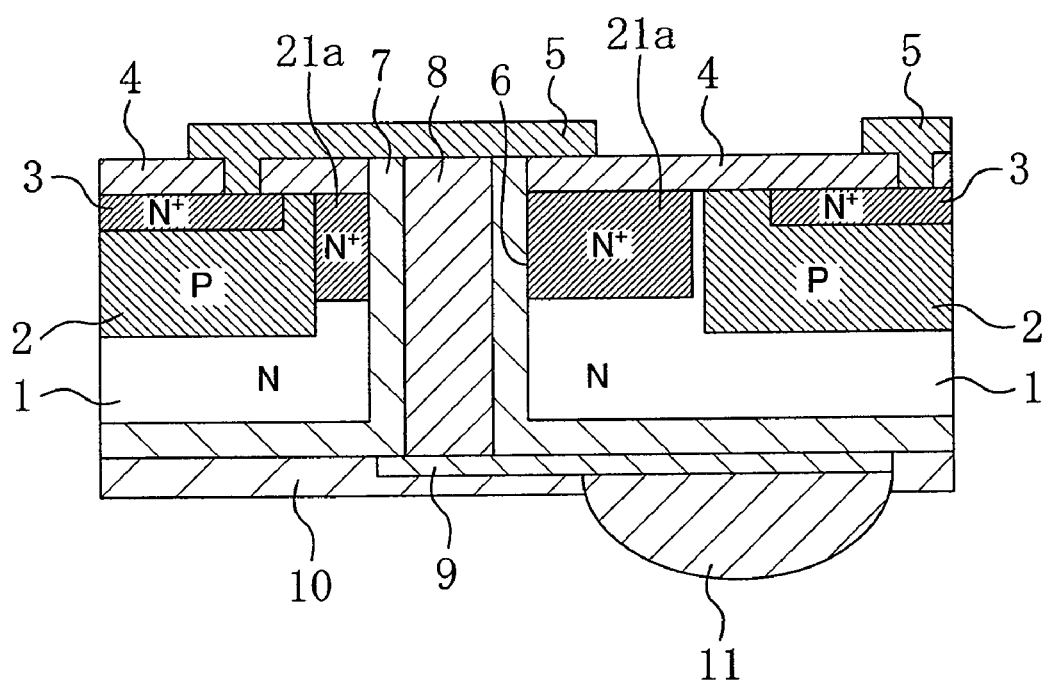
FIG. 3 is a diagram showing a structure of a solid-state imaging device according to Variation 2 of the first embodiment of the present invention.

FIG. 3 is a diagram showing a structure of a solid-state imaging device according to Variation 2 of the first embodiment of the present invention. Specifically, FIG. 3 is a cross-sectional view similar to that of FIG. 2B. Note that a plan view corresponding to the cross-sectional structure of FIG. 3 is similar to that of FIG. 2A.

The solid-state imaging device of Variation 2 of FIG. 3 has the following feature, as can be seen by comparing it with the solid-state imaging device of FIG. 2B. A region of an $N^+$-type semiconductor layer 21a that is formed in a peripheral portion of a through hole 6 in a surface layer portion of a semiconductor substrate 1, is larger than the region of the $N^+$-type semiconductor layer 21 of FIG. 2B (particularly, larger in a depth direction). Specifically, the $N^+$-type semiconductor layer 21a of Variation 2 of FIG. 3 has an impurity concentration of about $10 \times 10^{20}/cm^3$, which is higher than the impurity concentration of the $N^+$-type semiconductor layer 21 of Variation 1 of FIG. 2B. Note that the other parts are similar to those of FIGS. 1A and 1B.

According to the solid-state imaging device of Variation 2 having the structure of FIG. 3, the region of the $N^+$-type semiconductor layer 21a formed in the surface layer portion of the semiconductor substrate 1 is larger than the region of the $N^+$-type semiconductor layer 21 of Variation 1. Therefore, the formation of a leakage path below the pad portion 5 can be more reliably prevented, resulting in a solid-state imaging device having a higher sensitivity and a higher S/N ratio.

Note that, as is similar to Variation 1, Variation 2 is not limited to the structure in which the $N^+$-type semiconductor layer 21a surrounds the through hole 6.

—Variation 3 of First Embodiment—

Figure 4A:
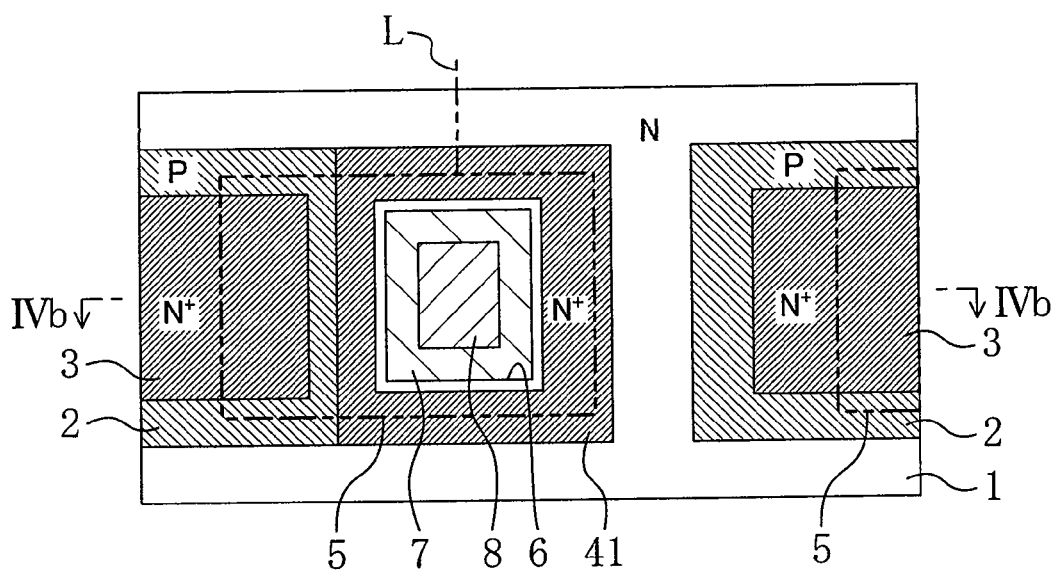
FIGS. 4A and 4B are diagrams showing a structure of a solid-state imaging device according to Variation 3 of the first embodiment of the present invention, specifically.
Figure 4B:
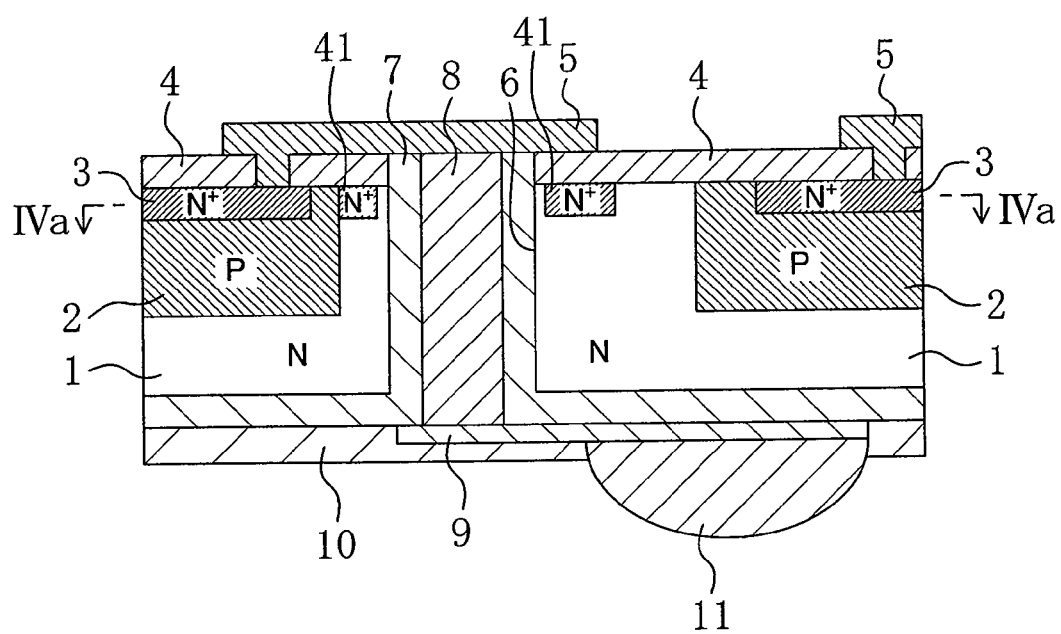

FIGS. 4A and 4B are diagrams showing a structure of a solid-state imaging device according to Variation 3 of the first embodiment of the present invention. Specifically, FIG. 4A is a plan view taken along line IVa-IVa of FIG. 4B, and FIG. 4B is a cross-sectional view taken along line IVb-IVb of FIG. 4A.

The solid-state imaging device of Variation 3 of FIGS. 4A and 4B has the following feature, as can be seen by comparing it with the solid-state imaging device of FIG. 2B. An $N^+$-type semiconductor layer 41 that is formed in a peripheral portion of a through hole 6 in a surface layer portion of a semiconductor substrate 1, is not adjacent to an edge portion of the through hole 6, i.e., is spaced from the edge portion of the through hole 6. Note that the other parts are similar to those of FIGS. 1A and 1B.

According to the solid-state imaging device of Variation 3 having the structure of FIGS. 4A and 4B, the following feature is obtained. If an $N^+$-type semiconductor layer (21, 21a) is adjacent to an edge portion of the through hole 6 as in Variations 1 and 2, the through hole 6 is formed, penetrating through the $N^+$-type semiconductor layer (21, 21a) and the semiconductor substrate 1, which have different impurity concentrations, so that a difference in etching rate may cause an abnormality in shape of the through hole 6. However, if the $N^+$-type semiconductor layer 41 is formed and spaced from the edge portion of the through hole 6 without being adjacent thereto, as described above, the shape of the through hole 6 can be easily controlled.

Figure 5:
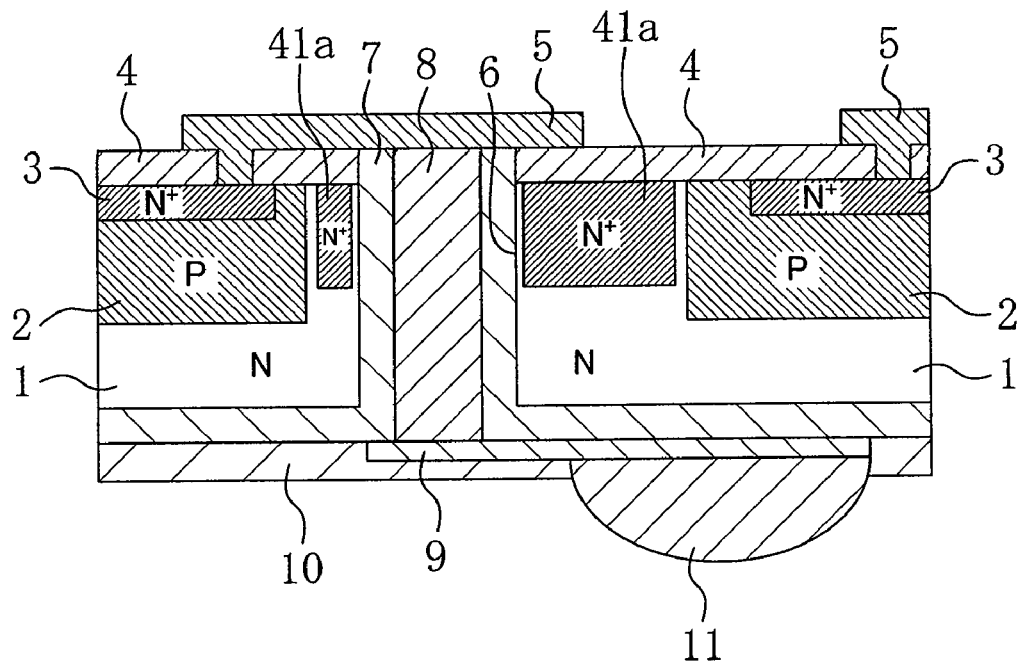
FIG. 5 is a diagram showing a structure of a solid-state imaging device according to Variation 3 of the first embodiment of the present invention.

Also, as shown in FIG. 5, an $N^+$-type semiconductor layer 41a having an impurity concentration and a large region similar to those of Variation 2 may be formed instead of the $N^+$-type semiconductor layer 41 of FIGS. 4A and 4B.

Note that, as is similar to Variation 1, the $N^+$-type semiconductor layer 41 of Variation 3 that is formed and spaced from the edge portion of the through hole 6 without being adjacent thereto, is not limited to a structure in which the $N^+$-type semiconductor layer 41 surrounds the through hole 6.

In Variation 3, the through hole 6 does not penetrate through the interface between the $N^+$-type semiconductor layer 21 and the semiconductor substrate 1 having different impurity concentrations, and the leakage path below the pad portion 5 can be suppressed, so that a solid-state imaging device having a high sensitivity and a high S/N ratio can be achieved.

—Variation 4 of First Embodiment—

Figure 6:
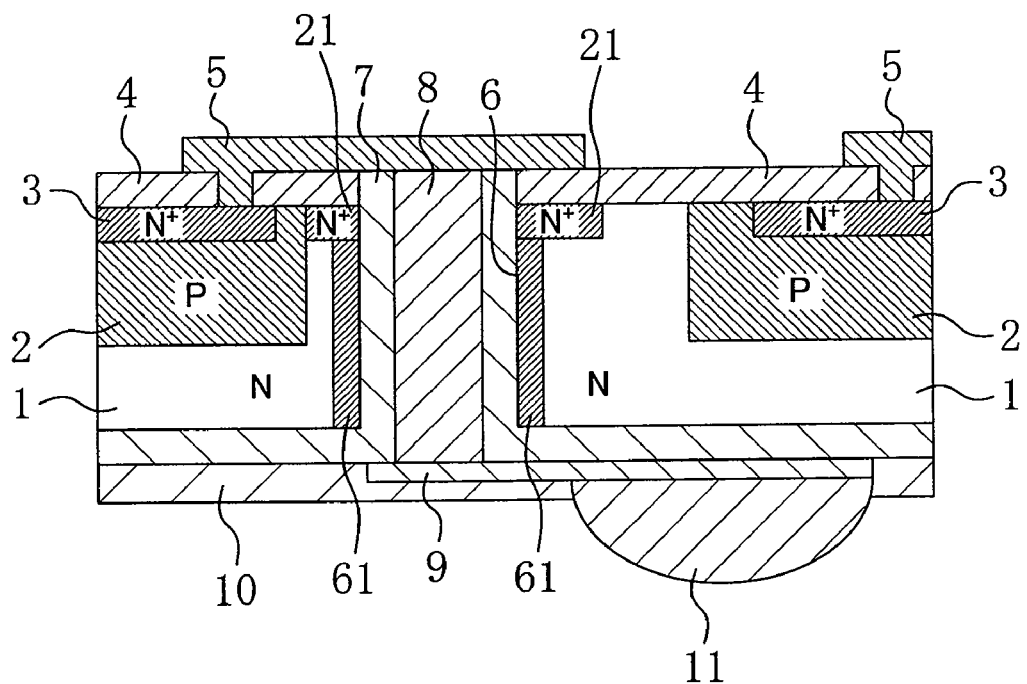
FIG. 6 is a diagram showing a structure of a solid-state imaging device according to Variation 4 of the first embodiment of the present invention.

FIG. 6 is a diagram showing a structure of a solid-state imaging device according to Variation 4 of the first embodiment of the present invention. Specifically, FIG. 6 is a cross-sectional view similar to FIG. 2B. Note that a plan view corresponding to the cross-sectional structure of FIG. 6 is similar to that of FIG. 2A.

The solid-state imaging device of Variation 4 of FIGS. 4A and 4B has the following feature, as can be seen by comparing it with the solid-state imaging device of FIG. 2B. In addition to an $N^+$-type semiconductor layer 21 that is formed in a peripheral portion of a through hole 6 in a surface layer portion of a semiconductor substrate 1, an $N^+$-type semiconductor layer 61 having an impurity concentration of about $10 \times 10^{20}/cm^3$ is also formed in a sidewall portion of the through hole 6. Here, the $N^+$-type semiconductor layer 61 can be formed by thermal diffusion, plasma ion implantation, tilted ion implantation, or the like after formation of the through hole 6. Alternatively, before formation of the through hole 6, $N^+$ ions that will remain in a sidewall portion of the through hole 6 may be implanted into the semiconductor substrate 1 in a manner that allows some $N^+$ ions to reach a rear surface of the semiconductor substrate 1. A region in which the $N^+$-type semiconductor layer 61 is formed does not necessarily need to reach the rear surface, as long as an influence of the spread of the PN junction region can be suppressed. Note that the other parts are similar to those of FIGS. 1A and 1B.

According to the solid-state imaging device of Variation 4 having the structure of FIG. 6, the following feature is obtained. If an N$^+$-type semiconductor layer (21) is formed only in a surface layer portion of a semiconductor substrate 1 as in Variation 1, then when a distance between the PN junction region of a P-type semiconductor layer 2 and an N$^+$-type semiconductor layer 3 and a through hole 6 is about 10 μm by miniaturization of the device, the spread PN junction region may be penetrated, likely leading to a leakage current. However, by forming the N$^+$-type semiconductor layer 61 in the sidewall portion of the through hole 6 as described above, a leakage path that would otherwise occur below the pad portion 5 due to the N$^+$-type semiconductor layer 21 can be prevented, and an influence of the spread PN junction region due to miniaturization can be prevented.

Also, as is similar to Variation 3, the N$^+$-type semiconductor layer 61 of Variation 4 may be formed in addition to the N$^+$-type semiconductor layer 41 that is formed and spaced from the edge portion of the through hole 6 without being adjacent thereto, instead of the N$^+$-type semiconductor layer 21.

Note that, as is similar to Variation 1, Variation 4 is not limited to the structure in which the N$^+$-type semiconductor layer 21 surrounds the through hole 6.

—Features of Fabrication Method in Variations 1 to 4—

The solid-state imaging device of each variation comprises an N$^+$-type semiconductor layer (21, 21a, 41, 41a) in a surface layer portion of the semiconductor substrate 1, and optionally, another N$^+$-type semiconductor layer (61) in a sidewall portion of the through hole 6. These N$^+$-type semiconductor layers can be formed at the same time when the N-type region of the photodiode is formed in the light receiving portion if the N$^+$-type semiconductor layers are formed relatively deep (its impurity concentration is about $10 \times 10^{15}/cm^3$). Also, the N$^+$-type semiconductor layers can be formed at the same time when the source/drain diffusion region of the MOSFET is formed or the cathode of the diode is formed in the peripheral circuit region if the N$^+$-type semiconductor layers are formed relatively shallow (its impurity concentration is about $10 \times 10^{20}/cm^3$). Note that the other steps of the method for fabricating the solid-state imaging device of this embodiment can be achieved by appropriately modifying a known fabrication method so that the features of the structure described above are achieved.

Second Embodiment

Figure 7A:
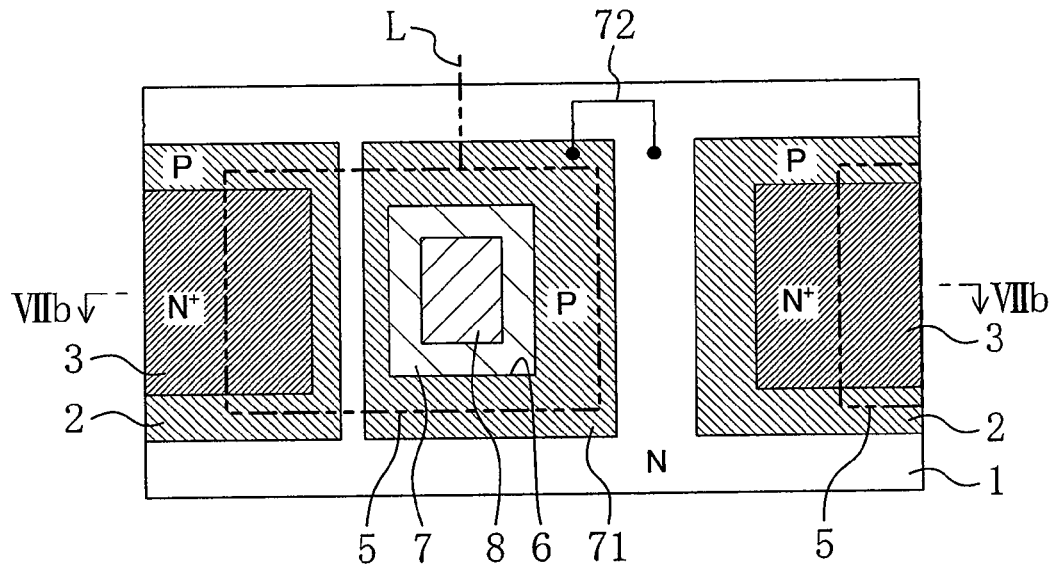
FIGS. 7A and 7B are diagrams showing a structure of a solid-state imaging device according to a second embodiment of the present invention, specifically.
Figure 7B:
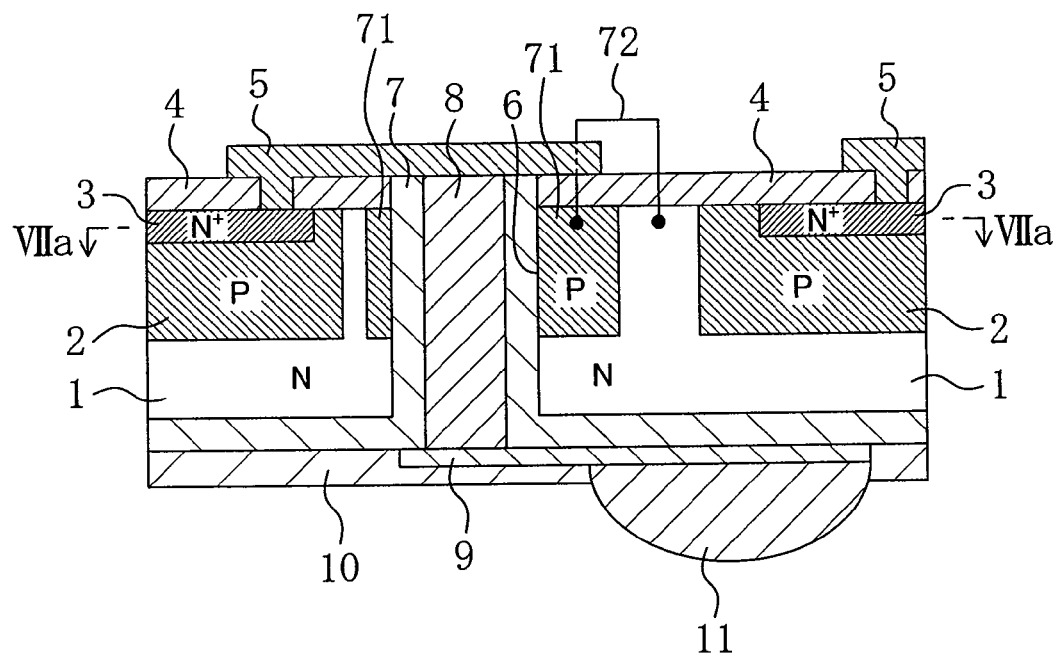

FIGS. 7A and 7B are diagrams showing a structure of a solid-state imaging device according to a second embodiment of the present invention, particularly showing a portion corresponding to the region a of the conventional device of FIG. 12. Specifically, FIG. 7A is a plan view taken along line VIIa-VIIa of FIG. 7B, and FIG. 7B is a cross-sectional view taken along line VIIb-VIIb of FIG. 7A.

As shown in FIGS. 7A and 7B, P-type semiconductor layers 2 and 71 having an impurity concentration of about $2.0 \times 10^{15}/cm^3$ are formed in a semiconductor substrate 1 made of N-type silicon having an impurity concentration of about $1.0 \times 10^{15}/cm^3$, and an N$^+$-type semiconductor layer 3 having an impurity concentration of about $10 \times 10^{20}/cm^3$ is formed in a surface layer portion of the P-type semiconductor layer 2. The P-type semiconductor layer 71 is separated from the neighboring P-type semiconductor layer 2, and is connected to the silicon substrate 1 via a wiring line 72. On a surface of the semiconductor substrate 1, an insulating film 4 is formed, covering the P-type semiconductor layers 2 and 71 and the N$^+$-type semiconductor layer 3 and having an opening portion through which a portion of the N$^+$-type semiconductor layer 3 is exposed.

The P-type semiconductor layer 2 and the N$^+$-type semiconductor layer 3 form a protective circuit in a peripheral circuit region (see 102 in FIG. 12). The P-type semiconductor layer 2 is preferably grounded so that electric charges are dissipated. The grounding of the P-type semiconductor layer 2 may be achieved by connecting it to the outside via a wiring line or a through electrode without forming the N$^+$-type semiconductor layer 3 (not shown). Moreover, if connection to the outside is established via a wiring line or a through electrode without forming the P-type semiconductor layer 2 or the N$^+$-type semiconductor layer 3, connection to the semiconductor substrate 1 can be achieved (not shown). By such connection, a voltage can also be applied to the semiconductor substrate 1, so that, for example, electric charges can be reset in a CCD solid-state imaging device.

Also, in an internal circuit region (see 101 in FIG. 12), in the P-type semiconductor layer 2, an imaging region having a plurality of light receiving portions that are arranged two-dimensionally and are used for generating signal electric charges by photoelectric conversion, vertical transfer portions (vertical CCDs) that are arranged along respective vertical columns of the light receiving portions, a horizontal transfer portion (horizontal CCD) that is provided adjacent to an end row of the light receiving portions, and a peripheral circuit region that is formed at an outer peripheral portion of the imaging region, are provided. Note that the light receiving portion in an internal circuit region, which is a photodiode made of the N$^+$-type semiconductor layer 3 formed in the P-type semiconductor layer 2, accumulates electric charges, depending on the intensity of received light.

The P-type semiconductor layer 2 and the N$^+$-type semiconductor layer 3 may be formed in the internal circuit region and the peripheral circuit region in the same step, thereby making it possible to reduce the number of steps. Alternatively, if the P-type semiconductor layer 2 and the N$^+$-type semiconductor layer 3 are formed in separated steps, their concentrations and shapes can be determined so that they have maximized characteristics.

A through hole 6 is formed in the insulating film 4, the semiconductor substrate 1 and the P-type semiconductor layer 71. The through hole 6, which penetrates through the insulating film 4, the semiconductor substrate 1 and the P-type semiconductor layer 71, has an opening diameter of about 70 μm and a depth of about 200 μm. An insulating film 7 is formed on a sidewall portion of the through hole 6 and a rear surface of the semiconductor substrate 1. A through electrode 8 is formed, filling an inside of the insulating film 7. A pad portion 5 preferably has a concave portion that is connected to the through electrode 8 so as to increase an area where the pad portion 5 contacts the through electrode 8 and provide reliable contact.

The pad portion 5, which is made of a conductive film that is connected via the opening portion of the insulating film 4 to the N$^+$-type semiconductor layer 3 and the through electrode 8, is formed on a front side of the semiconductor substrate 1, specifically on the insulating film 4 and the insulating film 7. The pad portion 5 is connected via a wiring line L to the internal circuit region 101 (see FIG. 12). On the other hand, a rear surface electrode 9 made of a conductive film that is connected to the through electrode 8, and an insulating resin layer 10 covering the rear surface electrode 9 and having an opening portion through which a portion of the rear surface electrode 9 is exposed, are formed on a rear side of the semiconductor substrate 1, specifically on the insulating film 7. A protruding electrode 11 made of a conductive film that is connected to the rear surface electrode 9 is formed in the opening portion of the insulating resin layer 10.

Although the insulating film 4 in the peripheral circuit region is indicated by a single reference numeral, the insulating film 4 in the internal circuit region may be formed of a plurality of films or a plurality of types of films since an electrode, a multi-layer wiring line or the like required to drive an internal circuit may be formed in the internal circuit region.

According to the solid-state imaging device of this embodiment having the structure of FIGS. 7A and 7B, the P-type semiconductor layer 71 separated from the neighboring P-type semiconductor layer 2 is formed, surrounding the through hole 6, and the P-type semiconductor layer 71 is connected via the wiring line 72 to the silicon substrate 1. Therefore, although the through hole 6 penetrates through a PN junction region as in the conventional art, since the P-type semiconductor layer 71 is connected to the silicon substrate 1, it is possible to reduce and suppress a leakage current of the PN junction due to etching damage or the like and a dark current that becomes more significant during an operation at high temperature. Also, since the P-type semiconductor layer 71 is independently formed, an influence on adjacent elements can be prevented. As a result, a solid-state imaging device having a high sensitivity and a high S/N ratio, and a camera comprising the solid-state imaging device can be achieved.

When the wiring line 72 is formed simultaneously in the step of forming the pad portion 5, the number of steps reduces. Further, since the wiring line 72 must be formed with the pad portion 5 kept off, such simultaneous formation can prevent shorts caused due to misalignment of the mask.

—Variation 1 of Second Embodiment—

Figure 8A:
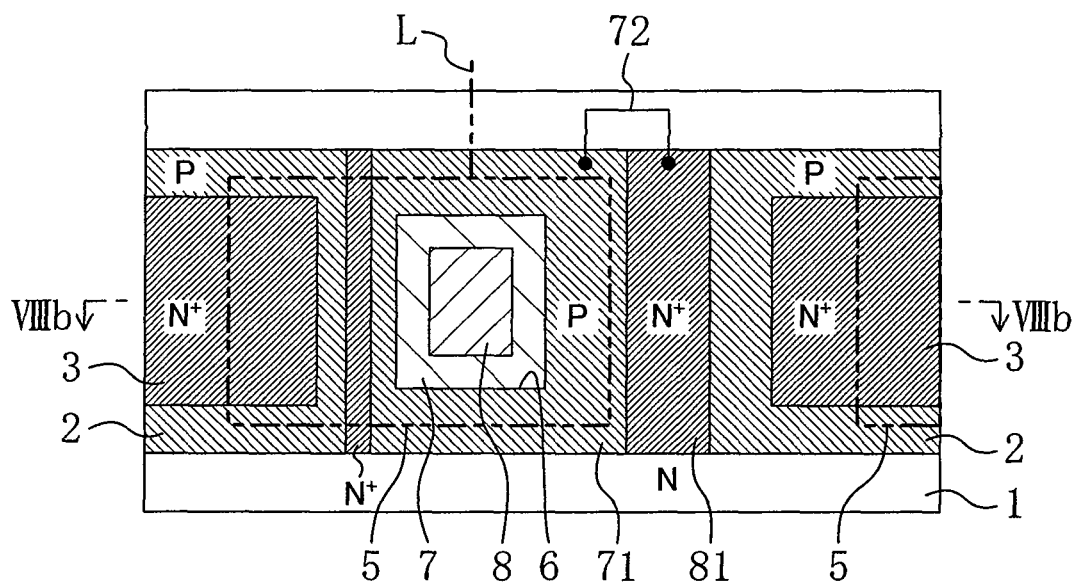
FIGS. 8A and 8B are diagrams showing a structure of a solid-state imaging device according to Variation 1 of the second embodiment of the present invention, specifically.
Figure 8B:
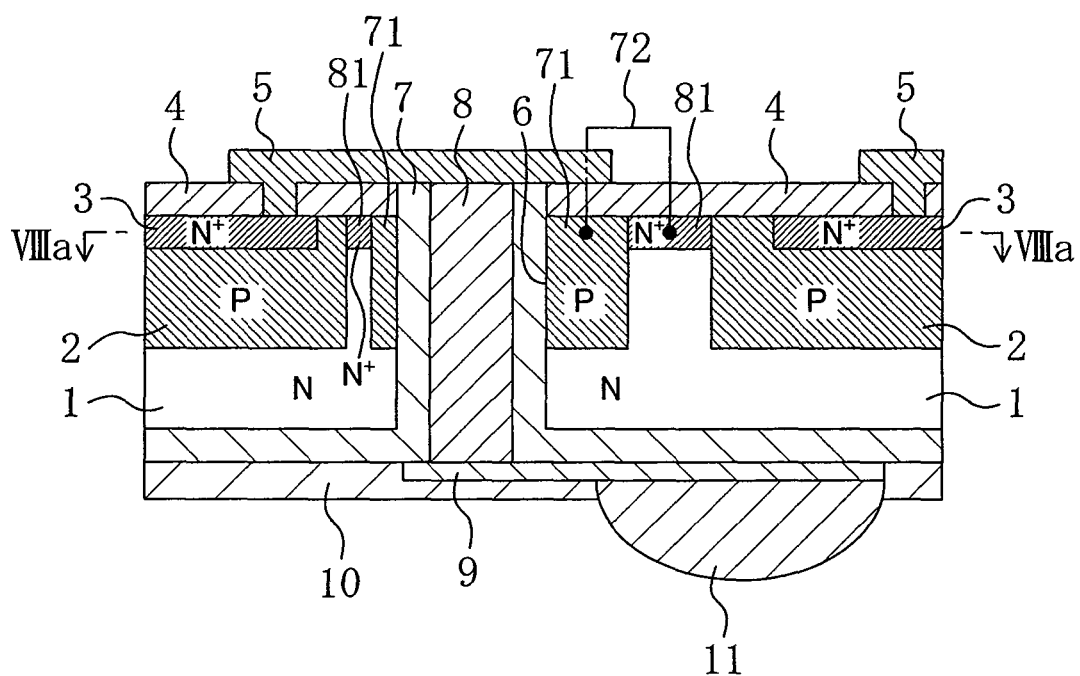

FIGS. 8A and 8B are diagrams showing a structure of a solid-state imaging device according to Variation 1 of the second embodiment of the present invention. Specifically, FIG. 8A is a plan view taken along line VIIIa-VIIIa of FIG. 8B, and FIG. 8B is a cross-sectional view taken along line VIIIb-VIIIb of FIG. 8A.

The solid-state imaging device of Variation 1 of FIGS. 8A and 8B has the following feature, as can be seen by comparing it with the solid-state imaging device of FIGS. 7A and 7B. An $N^+$-type semiconductor layer 81 having an impurity concentration of about $10 \times 10^{15}$ to $10^{20}/cm^3$ is formed in a region between the P-type semiconductor layer 71 and the P-type semiconductor layer 2 in a surface layer portion of the semiconductor substrate 1. Note that the other parts are similar to those of FIGS. 7A and 7B.

According to the solid-state imaging device of Variation 1 having the structure of FIGS. 8A and 8B, the following feature is obtained. When the semiconductor substrate 1 has a low impurity concentration as described above, a channel that becomes a leakage path is likely to be formed in a surface layer portion of the semiconductor substrate 1 below the pad portion 5. Nevertheless, as described above, the $N^+$-type semiconductor layer 81 is provided in the surface layer portion of the semiconductor substrate 1, thereby preventing reversal, i.e., preventing formation of a leakage path. As a result, a solid-state imaging device having a higher sensitivity and a higher S/N ratio can be achieved.

Although it has been described in Variation 1 that the $N^+$-type semiconductor layer 81 is formed on right- and left-hand sides of the through hole 6 (as viewed from above the drawing paper) as shown in FIG. 8A, the $N^+$-type semiconductor layer 81 may be formed at least only in a region adjacent to an edge portion facing the through hole 6 of the P-type semiconductor layer 2 (a left-hand portion as viewed from above the drawing paper) below the pad portion 5 without providing it on both the right- and left-hand sides of the through hole 6, so as to prevent formation of a leakage path.

The $N^+$-type semiconductor layer 81 and the $N^+$-type semiconductor layer 2 may be formed in the same step, thereby making it possible to reduce the number of steps. Alternatively, if the $N^+$-type semiconductor layer 81 and the $N^+$-type semiconductor layer 2 are formed in separated steps, their concentrations and shapes can be determined so that they have maximized characteristics.

—Variation 2 of Second Embodiment—

Figure 9:
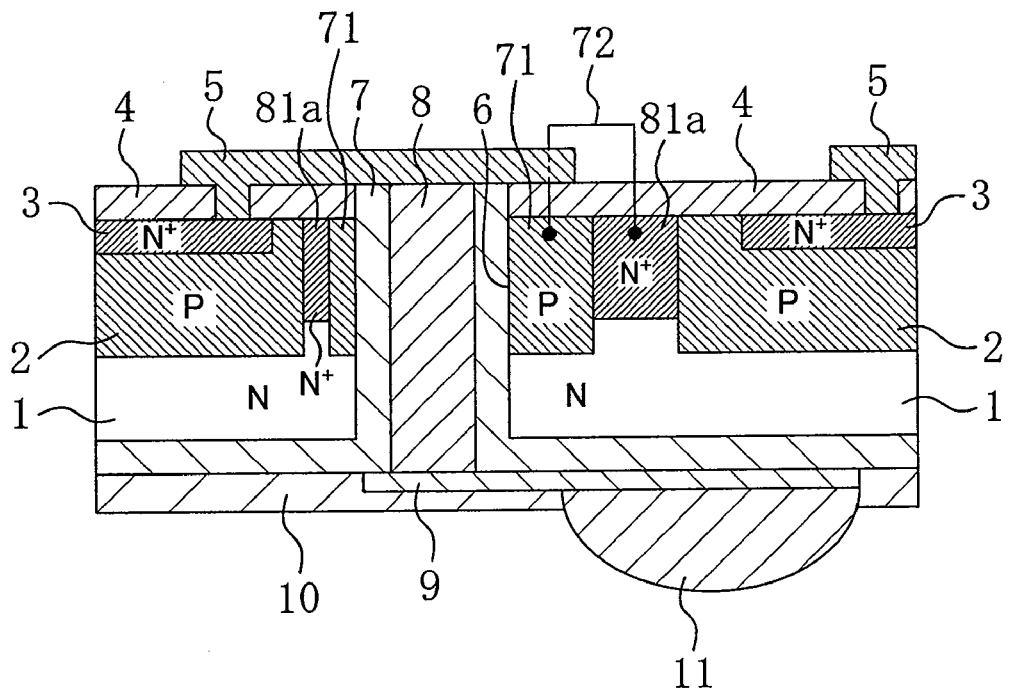
FIG. 9 is a diagram showing a structure of a solid-state imaging device according to Variation 2 of the second embodiment of the present invention.

FIG. 9 is a diagram showing a structure of a solid-state imaging device according to Variation 2 of the second embodiment of the present invention. Specifically, FIG. 9 is a cross-sectional view similar to that of FIG. 8B. Note that a plan view corresponding to the cross-sectional structure of FIG. 9 is similar to that of FIG. 8A.

The solid-state imaging device of Variation 2 of FIG. 9 has the following feature, as can be seen by comparing it with the solid-state imaging device of FIG. 8B. A region of an $N^+$-type semiconductor layer 81a that is formed in a region between the P-type semiconductor layer 71 and the P-type semiconductor layer 2 in a surface layer portion of a semiconductor substrate 1, is larger than the region of the $N^+$-type semiconductor layer 81 of FIG. 8B (particularly, larger in a depth direction). Specifically, the $N^+$-type semiconductor layer 81a of Variation 2 of FIG. 9 has an impurity concentration of about $10 \times 10^{20}/cm^3$, which is higher than the impurity concentration of the $N^+$-type semiconductor layer 81 of Variation 1 of FIG. 8B. Note that the other parts are similar to those of FIGS. 8A and 8B.

According to the solid-state imaging device of Variation 2 having the structure of FIG. 9, the region of the $N^+$-type semiconductor layer 81a formed in the surface layer portion of the semiconductor substrate 1 is larger than the region of the $N^+$-type semiconductor layer 81 of Variation 1. Therefore, the formation of a leakage path below the pad portion 5 can be more reliably prevented, resulting in a solid-state imaging device having a higher sensitivity and a higher S/N ratio.

Note that, as is similar to Variation 1, Variation 2 may has a structure in which the $N^+$-type semiconductor layer 81a is formed only on a left-hand side of the through hole 6 as viewed from above the drawing paper.

—Features of Fabrication Method in Variations 1 and 2—

The solid-state imaging device of each variation comprises an $N^+$-type semiconductor layer (81, 81a) in a surface layer portion of the semiconductor substrate 1. These $N^+$-type semiconductor layers can be formed at the same time when the N-type region of the photodiode is formed or the cathode of the diode is formed in the light receiving portion if the $N^+$-type semiconductor layers are formed relatively deep (its impurity concentration is about $10 \times 10^{15}/cm^3$). Also, the $N^+$-type semiconductor layers can be formed at the same time when the source/drain diffusion region of the MOSFET is formed in the peripheral circuit region if the $N^+$-type semiconductor layers are formed relatively shallow (its impurity concentration is about $10 \times 10^{20}/cm^3$). Note that the other steps of the method for fabricating the solid-state imaging device of this embodiment can be achieved by appropriately modifying a known fabrication method so that the features of the structure described above are achieved.

Third Embodiment

Figure 10:
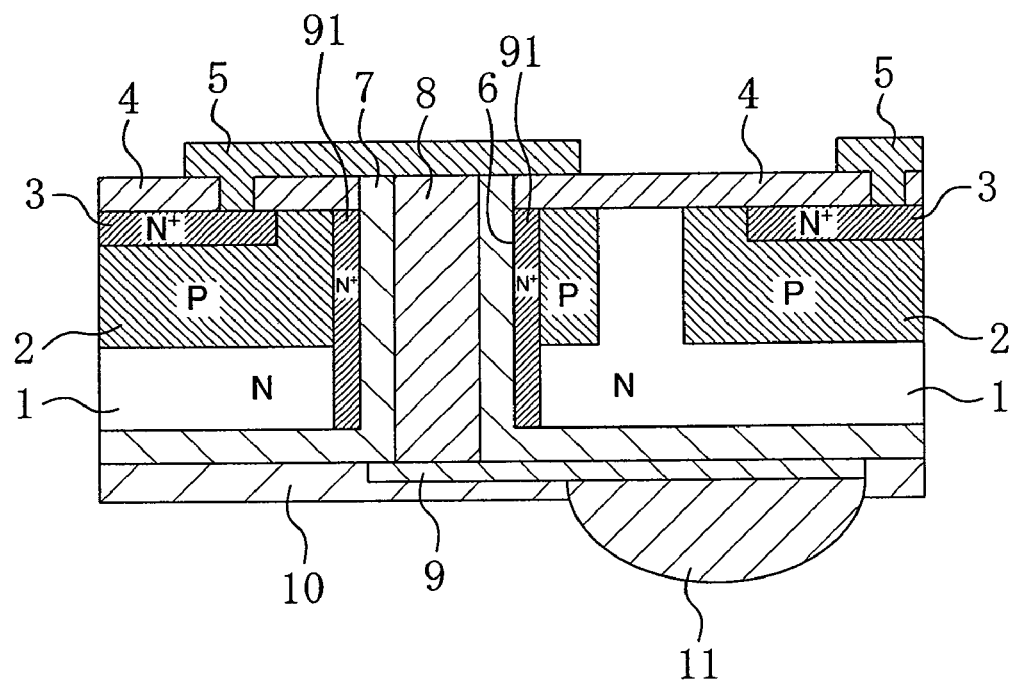
FIG. 10 is a diagram showing a structure of a solid-state imaging device according to a third embodiment of the present invention.

FIG. 10 is a diagram showing a structure of a solid-state imaging device according to a third embodiment of the present invention, particularly showing a portion corresponding to the region a of the conventional device of FIG. 12.

As shown in FIG. 10, P-type semiconductor layers 2 and 71 having an impurity concentration of about $2.0 \times 10^{15}/cm^3$ are formed in a semiconductor substrate 1 made of N-type silicon having an impurity concentration of about $1.0 \times 10^{15}/cm^3$, and an N$^+$-type semiconductor layer 3 having an impurity concentration of about $10 \times 10^{20}/cm^3$ is formed in a surface layer portion of the P-type semiconductor layer 2. The P-type semiconductor layer 2 is formed, surrounding a through hole 6 successively from below a pad portion 5 as described below. An N$^+$-type semiconductor layer 91 having an impurity concentration of about $10 \times 10^{15}$ to $10^{20}/cm^3$ is formed in a sidewall portion of the through hole 6, reaching from a front surface to a rear surface of the semiconductor substrate 1. On a surface of the semiconductor substrate 1, an insulating film 4 is formed, covering the P-type semiconductor layer 2 and the N$^+$-type semiconductor layers 3 and 91 and having an opening portion through which a portion of the N$^+$-type semiconductor layer 3 is exposed.

The P-type semiconductor layer 2 and the N$^+$-type semiconductor layer 3 form a protective circuit in a peripheral circuit region (see 102 in FIG. 12). The P-type semiconductor layer 2 is preferably grounded so that electric charges are dissipated. The grounding of the P-type semiconductor layer 2 may be achieved by connecting it to the outside via a wiring line or a through electrode without forming the N$^+$-type semiconductor layer 3 (not shown). Moreover, if connection to the outside is established via a wiring line or a through electrode without forming the P-type semiconductor layer 2 or the N$^+$-type semiconductor layer 3, connection to the semiconductor substrate 1 can be achieved (not shown). By such connection, a voltage can also be applied to the semiconductor substrate 1, so that, for example, electric charges can be reset in a CCD solid-state imaging device.

Also, in an internal circuit region (see 101 in FIG. 12), in the P-type semiconductor layer 2, an imaging region having a plurality of light receiving portions that are arranged two-dimensionally and are used for generating signal electric charges by photoelectric conversion, vertical transfer portions (vertical CCDs) that are arranged along respective vertical columns of the light receiving portions, a horizontal transfer portion (horizontal CCD) that is provided adjacent to an end row of the light receiving portions, and a peripheral circuit region that is formed at an outer peripheral portion of the imaging region, are provided. Note that the light receiving portion in the internal circuit, which is a photodiode made of the N$^+$-type semiconductor layer 3 formed in the P-type semiconductor layer 2, accumulates electric charges, depending on the intensity of received light.

The P-type semiconductor layer 2 and the N$^+$-type semiconductor layer 3 may be formed in the internal circuit region and the peripheral circuit region in the same step, thereby making it possible to reduce the number of steps. Alternatively, if the P-type semiconductor layer 2 and the N$^+$-type semiconductor layer 3 are formed in separated steps, their concentrations and shapes can be determined so that they have maximized characteristics.

A through hole 6 is formed in the insulating film 4 and the N$^+$-type semiconductor layer 91. The through hole 6, which penetrates through the insulating film 4 and the N$^+$-type semiconductor layer 91, has an opening diameter of about 70 μm and a depth of about 200 μm. An insulating film 7 is formed on a sidewall portion of the through hole 6 and a rear surface of the semiconductor substrate 1. A through electrode 8 is formed, filling an inside of the insulating film 7. A pad portion 5 preferably has a concave portion that is connected to the through electrode 8 so as to increase an area where the pad portion 5 contacts the through electrode 8 and provide reliable contact.

The pad portion 5, which is made of a conductive film that is connected via the opening portion of the insulating film 4 to the N$^+$-type semiconductor layer 3 and the through electrode 8, is formed on a front side of the semiconductor substrate 1, specifically on the insulating film 4 and the insulating film 7. The pad portion 5 is connected via a wiring line L to the internal circuit region 101 (see FIG. 12). On the other hand, a rear surface electrode 9 made of a conductive film that is connected to the through electrode 8, and an insulating resin layer 10 covering the rear surface electrode 9 and having an opening portion through which a portion of the rear surface electrode 9 is exposed, are formed on a rear side of the semiconductor substrate 1, specifically on the insulating film 7. A protruding electrode 11 made of a conductive film that is connected to the rear surface electrode 9 is formed in the opening portion of the insulating resin layer 10.

Although the insulating film 4 in the peripheral circuit region is indicated by a single reference numeral, the insulating film 4 in the internal circuit region may be formed of a plurality of films or a plurality of types of films since an electrode, a multi-layer wiring line or the like required to drive an internal circuit may be formed in the internal circuit region.

Figure 13A:
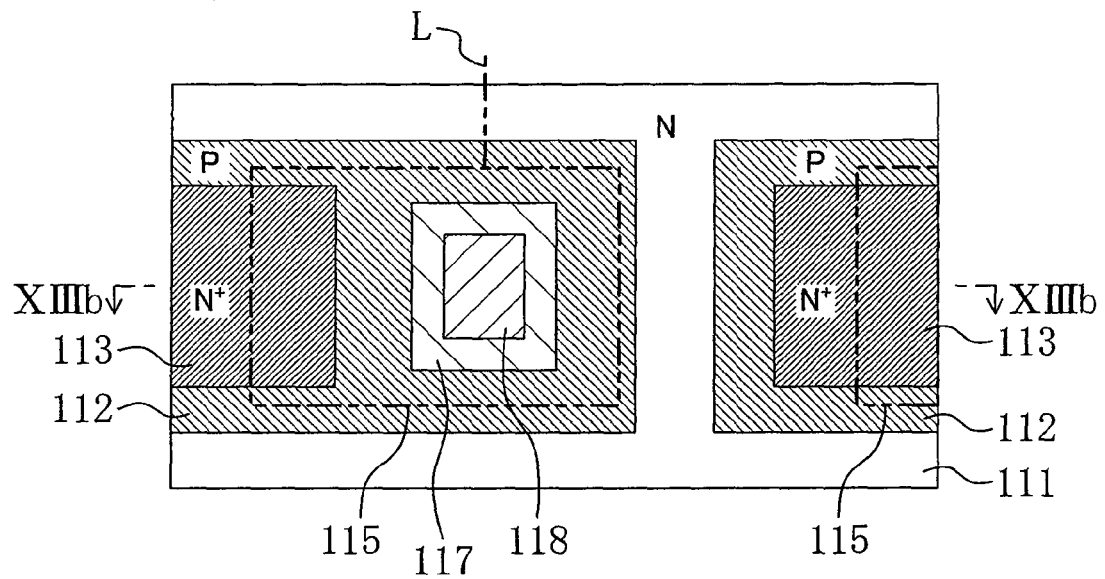
FIGS. 13A and 13B are diagrams showing a structure of the conventional solid-state imaging device, specifically, FIG.

Here, the N$^+$-type semiconductor layer 91 can be formed by thermal diffusion, plasma ion implantation, tilted ion implantation, or the like after formation of the through hole 6. Alternatively, before formation of the through hole 6, N$^+$ ions that will remain in a sidewall portion of the through hole 6 may be implanted into the semiconductor substrate 1 in a manner that allows some N$^+$ ions to reach a rear surface of the semiconductor substrate 1. A region in which the N$^+$-type semiconductor layer 91 is formed does not necessarily need to reach the rear surface, as long as an influence of the spread of the PN junction region can be suppressed. In this case, a plan view corresponding to FIG. 10 is such that the region in which the N$^+$-type semiconductor layer 91 is formed is provided in a peripheral portion of the through hole 116 of the conventional example of FIG. 13A, though not shown.

Figure 13B:
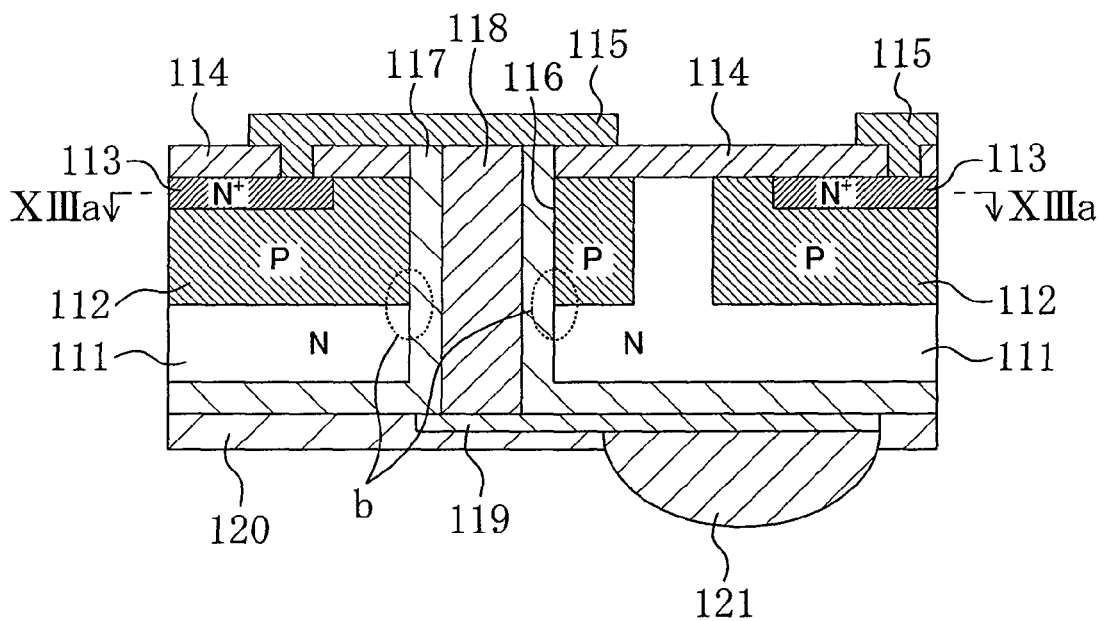

According to the solid-state imaging device of this embodiment having the structure of FIG. 10, the N$^+$-type semiconductor layer 91 is only provided on the sidewall portion of the through hole 6 in addition to the structure of the conventional example of FIG. 13, thereby making it possible to reduce and suppress a leakage current at the PN junction of the P-type semiconductor layer 2 and the silicon substrate 1 and a dark current that becomes more significant during an operation at high temperature. As a result, a solid-state imaging device having a high sensitivity and a high S/N ratio, and also a camera comprising such a solid-state imaging device, are obtained.

Note that the N$^+$-type semiconductor layer 91 can be formed at the same time when the N-type region of the photodiode is formed in the light receiving portion or when the source/drain diffusion region of the MOSFET is formed in the peripheral circuit region. Note that the other steps of the method for fabricating the solid-state imaging device of this embodiment can be achieved by appropriately modifying a known fabrication method so that the features of the structure described above are achieved.

Fourth Embodiment

Figure 11:
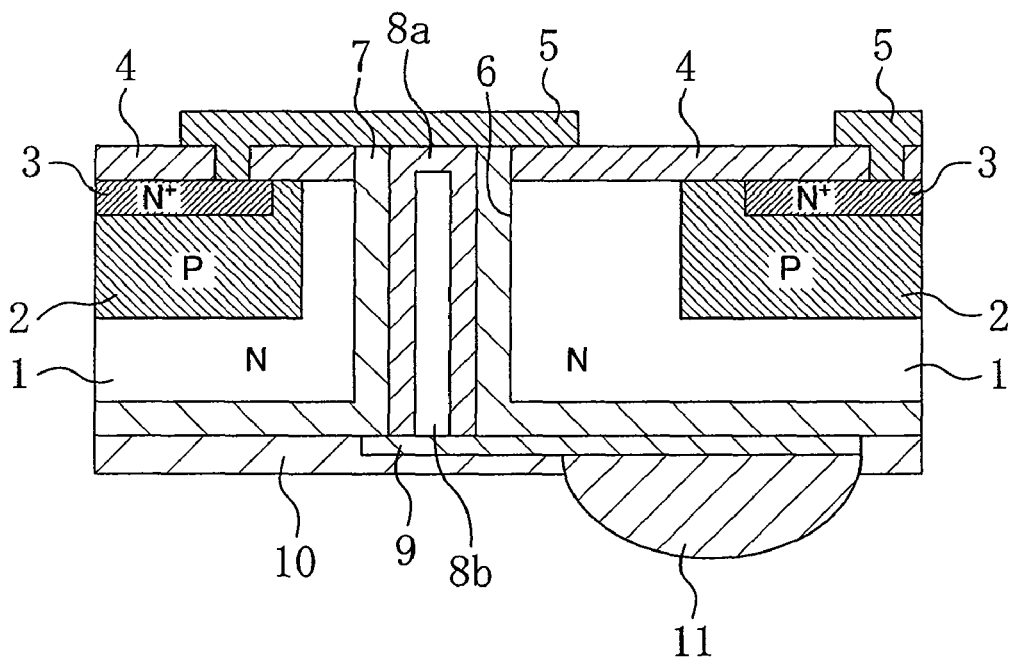
FIG. 11 is a diagram showing a structure of a solid-state imaging device according to a fourth embodiment of the present invention.

FIG. 11 is a diagram showing a structure of a solid-state imaging device according to a fourth embodiment of the present invention, particularly showing a portion corresponding to the region a of the conventional device of FIG. 12.

The solid-state imaging device of this embodiment has a structural feature that can be applied to any of the first to third embodiments. Specifically, the structural feature relates to an internal structure of a through hole 6. The other structural parts are the same as those of the embodiments described above. Therefore, the structural feature will be hereinafter mainly described.

As shown in FIG. 11, the solid-state imaging device of this embodiment has an internal structure of the through hole 6 in which an internal portion of a through electrode 8a formed inside the insulating film 7 is filled with a buried material different from a conductive film. Specifically, as is different from the first to third embodiments, the inside of the insulating film 7 is not fully filled with a metal, and only a portion required to electrical connection is formed as the through electrode 8a made of a conductive film, and the inside of the insulating film 7 is filled with other materials 8b, such as a resin or the like, in this embodiment. Such a structure can be used as the internal structure of the through hole 6 in which a through electrode is formed.

Note that the structure of the present invention and its fabrication method are useful for a solid-state imaging device and a camera comprising the solid-state imaging device.

What is claimed is:

1. A solid-state imaging device comprising:
   an imaging region having a plurality of light receiving portions arranged two-dimensionally and for generating signal electric charges by photoelectric conversion;
   a peripheral circuit region formed in an outer peripheral portion of the imaging region;
   a first conductivity type semiconductor substrate having the imaging region and the peripheral circuit region on a main surface thereof;
   a second conductivity type first semiconductor layer formed in the first conductivity type semiconductor substrate;
   a first conductivity type second semiconductor layer formed in first semiconductor layer;
   a through electrode formed in a through hole penetrating through the semiconductor substrate in a thickness direction of the semiconductor substrate;
   a pad portion formed on the semiconductor substrate and connected to the through electrode, and
   a first conductivity type third semiconductor layer that is adjacent to the first semiconductor layer covering the second semiconductor layer and electrically connected via the pad portion to the through electrode, and is formed in at least a region between the first semiconductor layer and the through hole, in a surface layer portion of the semiconductor substrate,
   wherein the through hole penetrates through a first conductivity type region of the semiconductor substrate, and
   the third semiconductor layer is a region having a higher impurity concentration than that of the semiconductor substrate.

2. The solid-state imaging device of claim 1, wherein the third semiconductor layer is formed and spaced from an edge portion of the through hole.

3. The solid-state imaging device of claim 1, further comprising:
   a first conductivity type fourth semiconductor layer formed in at least a sidewall portion of the through hole facing the first semiconductor layer covering the second semiconductor layer and electrically connected via the pad portion to the through electrode,
   wherein the fourth semiconductor layer is a region having a higher impurity concentration than that of the semiconductor substrate.

4. The solid-state imaging device of claim 1, further comprising:
   a second conductivity type fifth semiconductor layer formed in the semiconductor substrate,
   wherein the through hole penetrates through a first conductivity type region of the semiconductor substrate and a second conductivity type region of the fifth semiconductor layer, and
   the fifth semiconductor layer through which the through hole penetrates is separated from the first semiconductor layer, and is electrically connected to the semiconductor substrate.

5. The solid-state imaging device of claim 4, further comprising:
   a first conductivity type sixth semiconductor layer that is adjacent to the first semiconductor layer covering the second semiconductor layer and electrically connected via the pad portion to the through electrode, and is formed in at least a region between the first semiconductor layer and the fifth semiconductor layer, in a surface layer portion of the semiconductor substrate,
   wherein the sixth semiconductor layer is a region having a higher impurity concentration than that of the semiconductor substrate.

6. The solid-state imaging device of claim 1, wherein
   the through hole penetrates a first conductivity type region of the semiconductor substrate and a second conductivity type region of the first semiconductor layer,
   the solid-state imaging device further comprises a first conductivity type seventh semiconductor layer that is adjacent to the first semiconductor layer covering the second semiconductor layer and electrically connected via the pad portion to the through electrode, and is formed in at least a region facing the through hole, in a sidewall portion of the through hole, and
   the seventh semiconductor layer has a higher impurity concentration than that of the semiconductor substrate.

7. The solid-state imaging device of claim 1, wherein the first conductivity type is N type, and the second conductivity type is P type.

8. A method for fabricating the solid-state imaging device of claim 1, wherein the step of forming a region having a higher impurity concentration than that of the semiconductor substrate and the step of forming the light receiving portion are the same step.

9. A method for fabricating the solid-state imaging device of claim 1, wherein the step of forming a region having a higher impurity concentration than that of the semiconductor substrate and the step of forming a source/drain region of an MOSFET in the peripheral circuit region are the same step.

* * * * *